United States Patent [19]

Hoult

[11] 3,999,118

[45] Dec. 21, 1976

[54] SPECTROGRAPHIC ANALYSIS OF MATERIALS

[75] Inventor: David Ian Hoult, Wilmslow, England

[73] Assignee: National Research Development Corporation, London, England

[22] Filed: Feb. 27, 1975

[21] Appl. No.: 553,725

[30] Foreign Application Priority Data

Apr. 8, 1974 United Kingdom ............. 15530/74

[52] U.S. Cl. ........................... 324/.5 A; 324/.5 AC
[51] Int. Cl.² ....................................... G01R 33/08
[58] Field of Search ....................... 324/.5 A, .5 AC

[56] References Cited

UNITED STATES PATENTS

| 3,304,492 | 2/1967 | Glarum | 324/.5 A |
| 3,646,429 | 2/1972 | Takeuchi | 324/.5 A |

Primary Examiner—R. V. Rolinec
Assistant Examiner—Michael J. Tokar
Attorney, Agent, or Firm—Cushman, Darby & Cushman

[57] ABSTRACT

In nuclear magnetic resonance apparatus employing detection channels in phase quadrature an excitation-pulse transmitter includes an arrangement of switches and associated delay lines to enable successive pulses to be produced in phase quadrature and alternate pulses to be produced in phase opposition. The receiver output signals corresponding to the quadrature pulse-pairs may then be processed to cancel the effects of phase error and unequal gain in the detection channels and the signals corresponding to the opposing pulse-pairs may be processed to cancel systematic noise.

4 Claims, 7 Drawing Figures

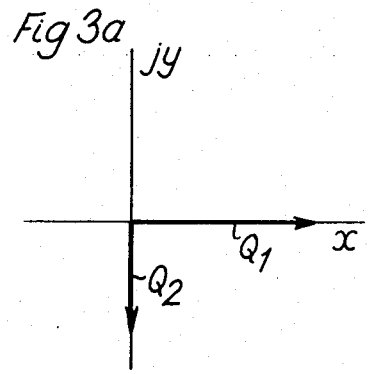
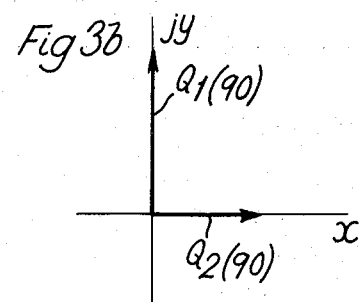
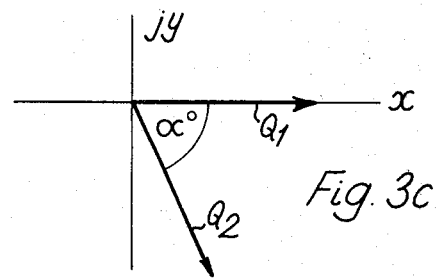
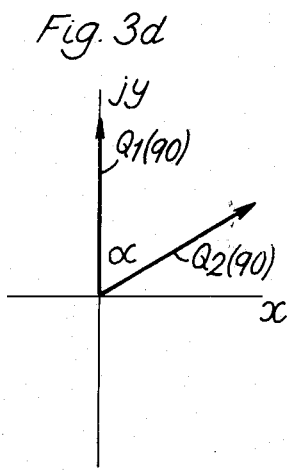
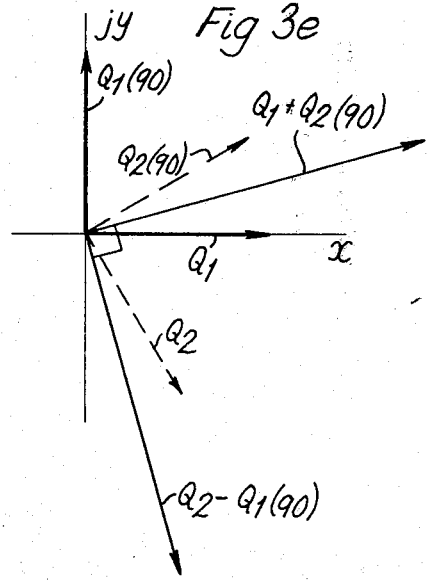

SPECTROGRAPHIC ANALYSIS OF MATERIALS

The present invention concerns nuclear magnetic resonance apparatus of the kind comprising a transmitter for exciting a specimen by means of a train of radiofrequency pulses and a receiver for the detection of resonance signals so excited, the receiver having two parallel audio-frequency channels each including a phase-sensitive detector operating in phase quadrature relative to the other and providing output signals from which a spectrum representing the specimen is derivable by suitable data routing processes.

N.M.R. spectrometers are well known and essentially consist of coils for generating an intense magnetic field in which a sample to be analysed can be placed together with a transmitter for subjecting the sample to radio frequency energy to cause nuclear magnetic resonance, and a probe having coils for picking up the resonance so induced. The radio frequency signal may be applied as a continuous wave but more usually in the form of pulses. The required spectrum is then derived with the aid of a Fourier transform, from the transient signal induced in the probe.

An output signal from the probe may have for example, for a single resonance, the form $$e^{-t/T_2} \cos(\omega t + \theta) \qquad (1)$$

$\omega$ may for example be about 129 MHz. Thus the frequency of this signal is too high to be handled by a computer or other data storage devices. Accordingly phase sensitive detection is used to reduce the frequency of the probe signal to the audio frequency range. In mathematical terms this is normally achieved by multiplying the probe signal by $\cos(\omega_r t + \phi)$ where $\omega_r$ may be the transmitter frequency.

The resultant audio frequency signal after this multiplication is equal to $$\frac{e^{-t/T_2}}{2} \cos\left[(\omega - \omega_r) t + \theta - \phi\right] \qquad (2)$$

The high frequency ($\omega + \omega_r$) resultant of the multiplication is of course filtered out. However, to obtain the frequency spectrum, it is necessary to take the Fourier transform of the audio frequency signal defined by equation (2) and the effect of using equation (2) rather than the original signal defined by equation (1) introduces constraints which have to be met if a valid result is to be obtained at all, and which degrade any result so obtained.

The most important of these constraints is that the transmitter frequency $\omega_r$ must lie on one side of the waveband of interest and must be separated from that waveband by a frequency sufficient to allow many oscillations at audio frequency in the envelope of decay of the signal. In mathematical terms, $|\omega - \omega_r| \gg 1/T_2$ for every resonance in the spectrum. Now in general, with reference to equation (2), it is impossible to determine from that signal to which side of the spectrum the transmitter frequency lies, and conversely, there is a "mirror" effect in which noise and extraneous signals are "reflected back" from the "other" side of the transmitter frequency on to the spectrum of interest thus degrading the ultimate results. The constraint also imposes the further disadvantage that to irradiate continuously a line in the spectrum (a technique frequently used for suppression or decoupling of that line) a source of continuous wave energy at the frequency of that line is called for in addition to the transmitter signal. Naturally the presence of two separate signals causes increased instrumental complexity.

To overcome these disadvantages it has been proposed to phase sensitive detect in quadrature the probe signal of equation (1) and then to take the Fourier transforms of both resulting audio-frequency signals. Thus, in a manner analogous to the derivation of equation (2) the initial probe signal is also multiplied by $-\sin(\omega_r t + \phi)$ to produce $$\frac{e^{-t/T_2}}{2} \sin\left[(\omega - \omega_r) t + \theta - \phi\right] \qquad (3)$$

Consider now equations (2) and (3). If for example $\theta = \phi$ and $\omega = \omega_r$ we have from equation (2) a graph which is an exponential decay and from equation (3) zero.

Secondly consider the case when $\omega_r < \omega$, that is when the transmitter frequency lies to the left of the spectrum. In this case the two equations give decaying sine waves 90° out of phase.

Now consider the case where $\omega_r > \omega$, that is when the transmitter frequency lies to the right of the spectrum. The result from equation (2) is identical to the case $\omega_r < \omega$ thus confirming that from this equation alone it is impossible to determine on which side of the spectrum the transmitter frequency lies. The result from equation (3) is again a decaying sine wave but in this case there is 180° phase shift when compared to the $\omega_r < \omega$ situation. This phase shift has an important effect when the Fourier transforms of the two signals are taken.

Now the Fourier transforms of equations (2) and (3) which are needed to produce the required absorption signal can be written in general form as $$\int_0^\infty \tfrac{1}{2} e^{-t/T_2} \cos \Delta \omega t \cos \omega t \, dt \qquad (4)$$

$$\int_0^\infty \tfrac{1}{2} e^{-t/T_2} \sin \Delta \omega t \sin \omega t \, dt \qquad (5)$$

where $\Delta \omega = (\omega - \omega_r)$
and it can readily be seen that when $\omega_r \ll \omega$ the Fourier transforms of equations (4) and (5) are identical and give a single peak. Furthermore the Fourier transform of equation (4) when $\omega_r \gg \omega$ is again identical to the situation when $\omega_r \gg \omega$. However, when $\omega_r > \omega$ the transform of equation (5) gives an inverted peak when compared to all the other transforms. From this it can be appreciated that to obtain the total signal when $\omega_r < \omega$ the two Fourier transforms are added whilst to obtain the total signal when $\omega_r > \omega$ the two transforms are subtracted. This procedure obviously provides a method by which the position of the transmitter signal in the spectrum can be readily determined. Furthermore it removes the constraint, allowing the transmitter signal to be placed within the centre of the spectrum instead of at the extreme edges. This in turn means that an unwanted peak can be suppressed by a small continuous irradiation at the transmitter frequency $\omega_r$, that the signal-to-noise ratio of the spectrum is improved, and that the transmitter pulse power requirement is reduced.

The carrying out of quadrature N.M.R. experiments of this kind has previously involved ensuring that the two audio-frequency channels of a spectrometer are matched to a very high degree of accuracy both in phase and in gain and that the two phase sensitive detections are accurately in quadrature. If these conditions are not met, the spectra obtained become extremely distorted and it is this problem which has hitherto prevented the wide use of quadrature N.M.R. despite its considerable advantages over single-phase N.M.R.

In accordance with the present invention these advantages may be more fully realised by providing in apparatus of the kind specified a transmitter which includes means operative to render successive ones of said pulses in phase quadrature, whereby the data routing processes may include vectorial summation related to those of said receiver output signals which correspond to pairs of said successive pulses.

The summation process has the effect of substantially cancelling errors due to difference in gain and departure from phase quadrature between the two audio-frequency channels. Additionally, systematic noise can be substantially cancelled by summation of outputs derived from pairs of excitation pulses in phase opposition.

An embodiment of the present invention will now be described by way of example and with reference to the accompanying drawings, in which:

FIGS. 3a to 3e is a sequence of Argand diagrams showing the effect of cyclically varying the phase of the energising pulses from the transmitter shown in FIG. 1.

Figure 1:
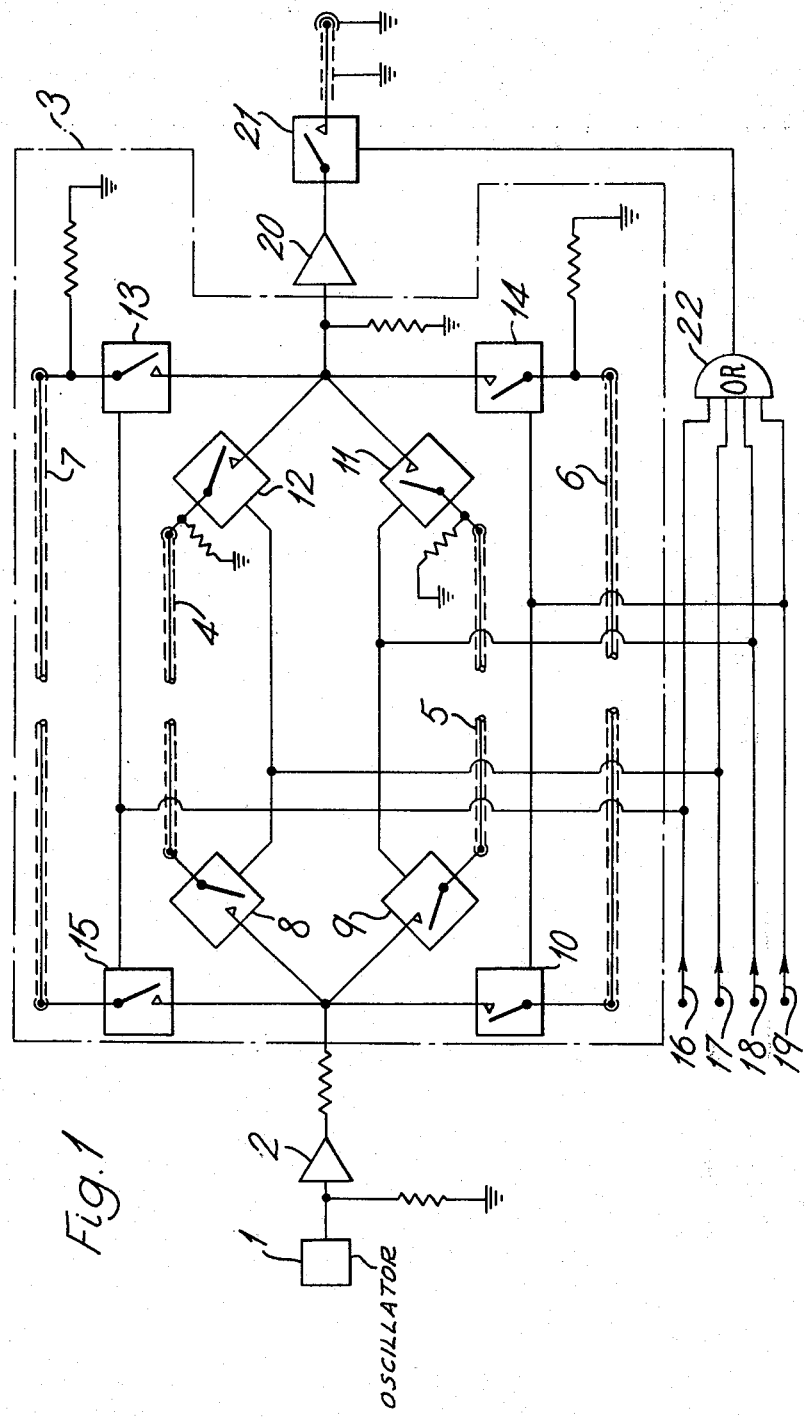
FIG. 1 is a block diagram of a transmitter for use with an N.M.R. spectrometer and constructed in accordance with the present invention.

The transmitter shown in FIG. 1 consists of a crystal oscillator 1 of known kind capable of continuously providing extremely stable radio frequency energy. The output of the oscillator 1 is taken via an amplifier 2 to a switched phase shifter generally indicated at 3 and having four coaxial cables 4, 5, 6, 7 through which the oscillator signal can be selectively switched for desired short periods of time by F.E.T. switches 8 to 15 the lengths of the lines 4 to 7 being so chosen that by cyclically switching the oscillator output through each line in turn the required phase shift is introduced. Thus by cyclically switching under the control of logic inputs 16 to 19 the oscillator output from line to line the phase of the oscillator signal is sequentially shifted by 0°, 90°, 180°, 270° and so on.

The resultant phase shifted signal is amplified by an amplifier 20, and gated by a high isolation gate 21 controlled by an "OR" gate 22 to which the logic inputs are also connected, prior to being amplified to a high power in an output stage (not shown).

The radio frequency pulse so generated is used in a manner well known in the art to induce transient nuclear magnetic resonance in a sample subjected to an intense magnetic field. It is felt this part of the apparatus does not need description as it it so well known.

The signal is induced by the nuclear magnetism is the pick-up coils in an N.M.R. probe. Again this part of the spectrometer is totally standard and as such does not require detailed description. The signal picked up by the probe contains all the available information about the nuclear condition of the sample in terms of the variables amplitude, frequency and phase.

Figure 2:
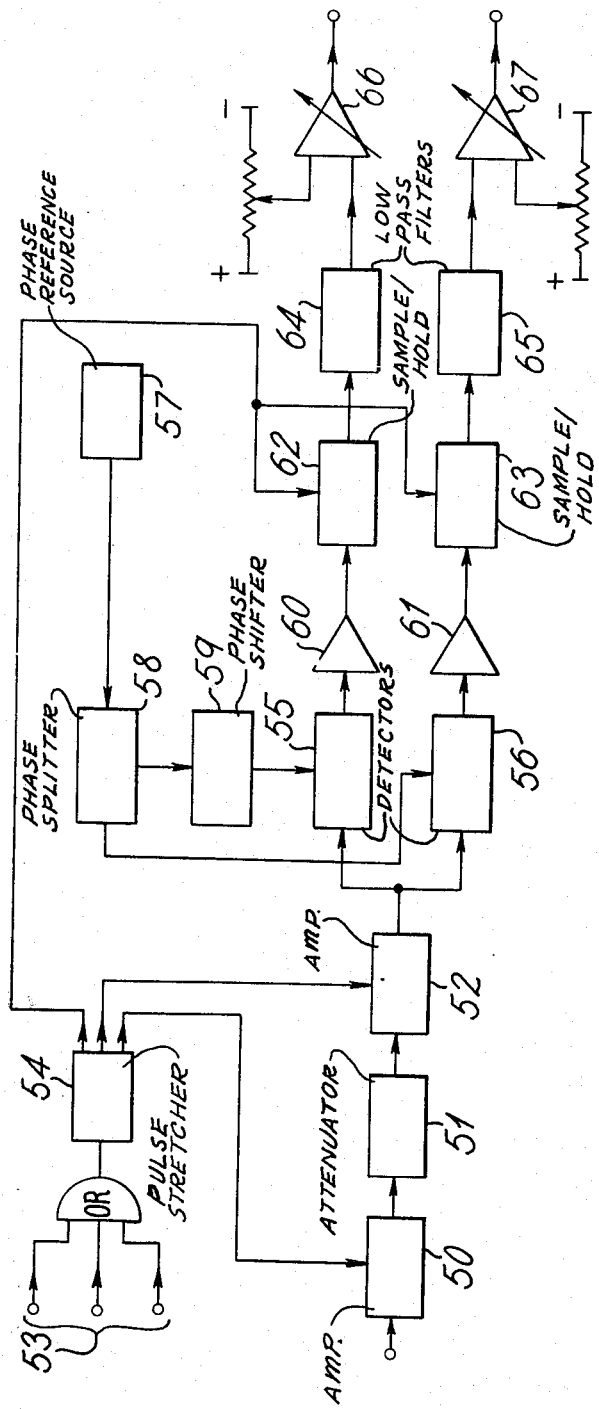
FIG. 2 is a block diagram of a receiver for use with an N.M.R. spectrometer and for use in combination with the transmitter of FIG. 1.

Referring now to FIG. 2 the probe signal is amplified in an amplifier 50, attenuated in an attenuator 51 and further amplified in an amplifier 52. In order to prevent damage to the probe signal a gating system including suppression inputs 53 and a pulse stretcher 54 is used to gate the amplifiers 50, 52 so that they do not operate for the duration of, and immediately subsequent to, the radio frequency signal. The output of the amplifier 52 is taken to two parallel phase sensitive detectors 55, 56 driven by a variable phase reference source 57 the output of which is split into two by a splitter 58. In order to shift the phase of phase sensitive detector 55 by 90° the output of the splitter 58 connected to it is taken via a 90° phase shifter at 59. The outputs of the detectors 55, 56 are amplified by amplifiers 60, 61, and the accuracy of the setting of the phase shifter at 59 is checked by monitoring the average product of the audio frequency outputs of 60, 61. The receiver gating circuit described prevents "pulse breakthrough" of the radio frequency signal, but does not deal with what is known as the "leakage pulse" — the total absence of output of any description from amplifier 52 during the period of receiver gating. This pulse is dealt with in sample and hold circuits 62, 63. These are also controlled by signals from the pulse stretcher 54 and they sample and hold the average outputs of the detectors 55, 56 immediately prior to a pulse and then hold that average value during the pulse and subsequent unwanted transients. The subsequent signals from the circuits 62, 63 pass through low-pass filters 64, 65 and differential amplifiers 66, 67 and thereafter are available for computation in suitable data processors.

It can thus be seen that the transmitter provides radio frequency pulses the phases of which are shifted cyclically through 90° at each pulse, and that the receiver provides a circuit for detecting the probe signal in quadrature.

How this can be used to remove the previous difficulties already described in matching the quadrature channels will now be discussed.

Consider the situation when the gain in the two detectors or audio frequency channels is different but the phase shift is correct between the two channels.

The outputs of the two channels can most simply be represented on an Argand diagram of the kind shown in FIG. 3a. This represents two signals some time after a transmitter pulse. Thus from equation (2) there is obtained, for example, a value $Q_1$ which is represented in the x axis. From equation (3) we obtain a value $Q_2$ exactly 90° out of phase with $Q_1$. If the gains in the detector channels were identical then $Q_1$ would equal $Q_2$ in length. However, they are not so that $Q_1 \neq Q_2$. Consider now a subsequent transmitter pulse phase shifted by 90°. The resultant signals are shown in FIG. 3b: the magnitudes of $Q_1(90)$ and $Q_2(90)$ remain the same but they are both shifted through 90°. It is now apparent that by adding the two signals obtained from the two pulses along the x axis we obtain $Q_1 + Q_2$ and by subtracting the two signals along the jy axis we again obtain $Q_2 + Q_1$. In fact the resultant two signals are of the same length and the variation in gain between the two detector channels has been eliminated.

Now consider the condition in which the gains in the detector channels are accurately matched but the phase shift is incorrect. FIG. 3c shows such a situation. $Q_1 = Q_2$ but there is less than a 90° phase shift between them. Now shift the transmitter phase by 90°. The result is shown in FIG. 3d. It can readily be appreciated that by performing vector addition on $Q_1$ and $Q_2(90)$ and vector subtraction on $Q_1(90)$ and $Q_2$ we obtain the Argand diagram of FIG. 3e in which the resultant signals are exactly 90° out of phase. A similar operation can be performed to compensate for a phase shift of greater than 90°.

In practice, the phase and amplitude settings are in error, (including the transmitter phase shifts), but it may be shown that the combined effect of these errors is second order in magnitude and negligible.

Thus by shifting the phase of the transmitter 90° between pulses and performing simple addition and subtraction on the resultant detected signals it has proved possible to eliminate difficulties caused by the channels being phased incorrectly and having different gains.

A further advantage of shifting the transmitter phase occurs when the transmitter signal is shifted through 180°. This inverts the output signals and by subtracting the inverted signals from the original signal the systematic noise can be eliminated whilst the signal is increased.

Thus by utilising the transmitter circuit of FIG. 1 to change the transmitter phase cyclically by 0°, 90° 180° and 270° etc. on successive pulses, and by performing the appropriate additions and subtractions in a computer, quadrature N.M.R. becomes a very attractive proposition without the necessity for exceedingly accurate matching in the audio frequency channels and exceedingly accurate quadrature detection.

I claim:

1. Nuclear magnetic resonance apparatus comprising:
   pulse modulated radio-frequency transmitter means for exciting a specimen by means of a train of radio-frequency pulses, successive ones of which are in relative phase quadrature;
   receiver means for producing two audio frequency signals in response to the detection of transient radio-frequency resonance signals from the specimen so excited, said receiver means comprising;
   similar first and second detector means each having first and second inputs and each producing, in response to the application of first and second sinusoidal signals respectively to its first and second inputs, an output signal having a frequency and phase angle whose values are respectively equal to the differences between the frequencies and phase angles of said first and second sinusoidal signals,
   means for applying to the respective first inputs of said first and second detector means two substantially identical sinusoidal signals derived from and having the same transient form as said resonance signals, and
   means for applying to the respective second inputs of said first and second detector means first and second sinusoidal reference signals which are substantially identical except for being in phase quadrature and which have a frequency close to that of said two substantially identical signals.

2. Nuclear magnetic resonance apparatus according to claim 1, wherein said transmitter means includes means for causing alternate ones of said pulses to be in phase opposition.

3. A method for use in the investigation of nuclear magnetic resonance in a specimen, the method comprising:
   exciting transient radio-frequency resonance signals in the specimen by means of a train of radio-frequency pulses successive ones of which are in relative phase quadrature;
   deriving from said resonance signals two substantially identical sinusoidal transient signals having the same transient form as said resonance signals;
   producing two sinusoidal reference signals which are substantially identical except for being in phase quadrature and which have a frequency close to that of said two sinusoidal transient signals;
   multiplying each of said sinusoidal transient signals by a different one of said reference signals to produce two output signals each having sum and difference frequency components which correspond to the sum and difference respectively of the frequencies of said sinusoidal transient signals and said reference signals; and
   selecting said difference frequency component from each of said two output signals.

4. A method for use in the investigation of nuclear magnetic resonance according to claim 3 wherein said step of exciting includes the step of exciting alternate ones of said train of radio-frequency pulses in phase opposition.

* * * * *

UNITED STATES PATENT OFFICE
CERTIFICATE OF CORRECTION

Patent No. 3,999,118          Dated  December 21, 1976

Inventor(s)  David Ian HOULT

It is certified that error appears in the above-identified patent and that said Letters Patent are hereby corrected as shown below:

Column 2, line 56 for $\omega_r \gg \omega$     read  $\omega_r \ll \omega$

Signed and Sealed this

Twenty-sixth Day of April 1977

[SEAL]

Attest:

RUTH C. MASON
*Attesting Officer*

C. MARSHALL DANN
*Commissioner of Patents and Trademarks*